United States Patent [19]

Williams, Jr.

[11] 4,200,170

[45] Apr. 29, 1980

[54] PYRAMID SPEAKER ASSEMBLY

[76] Inventor: John H. Williams, Jr., 4865 S. Lawton, Tulsa, Okla. 74107

[21] Appl. No.: 828,316

[22] Filed: Aug. 29, 1977

[51] Int. Cl.$^2$ ........................ H05K 5/00; A47B 81/06

[52] U.S. Cl. .................................... 181/155; 181/144; 181/146; 181/199

[58] Field of Search ................................ 181/144–149, 181/152, 155, 158, 199; 179/1 E, 116

[56] References Cited

U.S. PATENT DOCUMENTS 2,038,253 4/1936 Wheeler et al. ..................... 181/155

2,065,367 12/1936 Evans .................................. 181/144

FOREIGN PATENT DOCUMENTS 909225 12/1945 France .................................. 181/155

*Primary Examiner*—Stephen J. Tomsky

*Attorney, Agent, or Firm*—Head & Johnson

[57] ABSTRACT

A speaker assembly comprising a first cabinet or housing of a pyramidal configuration having a speaker element mounted therein in such a manner that the sound emitting from the speaker is concentrated in a direction outwardly of the pyramid, and a second housing of pyramidal configuration disposed in spaced relation to the speaker element whereby the sound emitting therefrom is directed against the walls of the second pyramid to provide a complete sound emission from the assembly through three hundred and sixty degrees.

4 Claims, 6 Drawing Figures

PYRAMID SPEAKER ASSEMBLY

BACKGROUND OF THE INVENTION

1. Field of the Invention

This invention relates to improvements in speaker assemblies, and more particularly, but not by way of limitation, to an improved stereophonic speaker assembly.

2. Description of the Prior Art

The speaker assemblies in widespread usage today for producing stereophonic sound normally comprise at least two speaker housings disposed in spaced relation and emitting sound therefrom in such a manner that some portion of the two sound patterns overlap, producing a stereophonic result in the area of the overlapping. A person disposed in the area of the overlap hears the sound in stereo, but when disposed out of the overlapping area, the sound is not stereo. The speaker assemblies in use today usually provide a relatively small area of overlapping sound, and thus the stereophonic results are limited.

SUMMARY OF THE INVENTION

The present invention contemplates a novel speaker assembly which has been particularly designed and constructed for producing a greatly improved stereophonic effect throughout a substantially greater area than heretofore possible. Each speaker in the stereophonic system of the invention produces sound which is emitted through a three hundred and sixty degree range, thus resulting in a substantially completely saturated overlapping of the sound throughout the room or area wherein the speakers are installed. Each speaker assembly comprises a housing of a substantially pyramidal configuration and having any suitable speaker element mounted therein whereby the concentration of sound emitted from the speaker is directed away from the interior of the pyramid. A second housing of pyramidal configuration is disposed in spaced relation with respect to the first housing and speaker mounted therein, with the peak of the second pyramid being substantially centrally disposed with respect to the speaker in order that the sound emitting from the speaker is directed against all of the sides of the outer periphery of the second pyramid. This spreads the sonic frequency substantially equally throughout the entire three hundred sixty degrees or universally around the open area surrounding the second pyramid. Thus, when two or more of the speaker assemblies are utilized in combination, a substantially complete overlapping of the sound emitting from each speaker assembly is achieved, resulting in a widespread stereophonic effect in substantially the entire area of a room or space wherein the speaker assemblies are installed. In addition, it has been found that there is substantially no distortion of the sound emitting from the outer periphery of the second pyramid, thus providing not only a wider area of stereophonic effect, but also a much greater or higher quality for the produced sound. Of course, substantially any desired arrangement or pyramid housings in combination with a speaker unit may be utilized which results in a spreading of the sound from the outer periphery of a pyramid.

DESCRIPTION OF THE PREFERRED EMBODIMENTS

Figure 1:
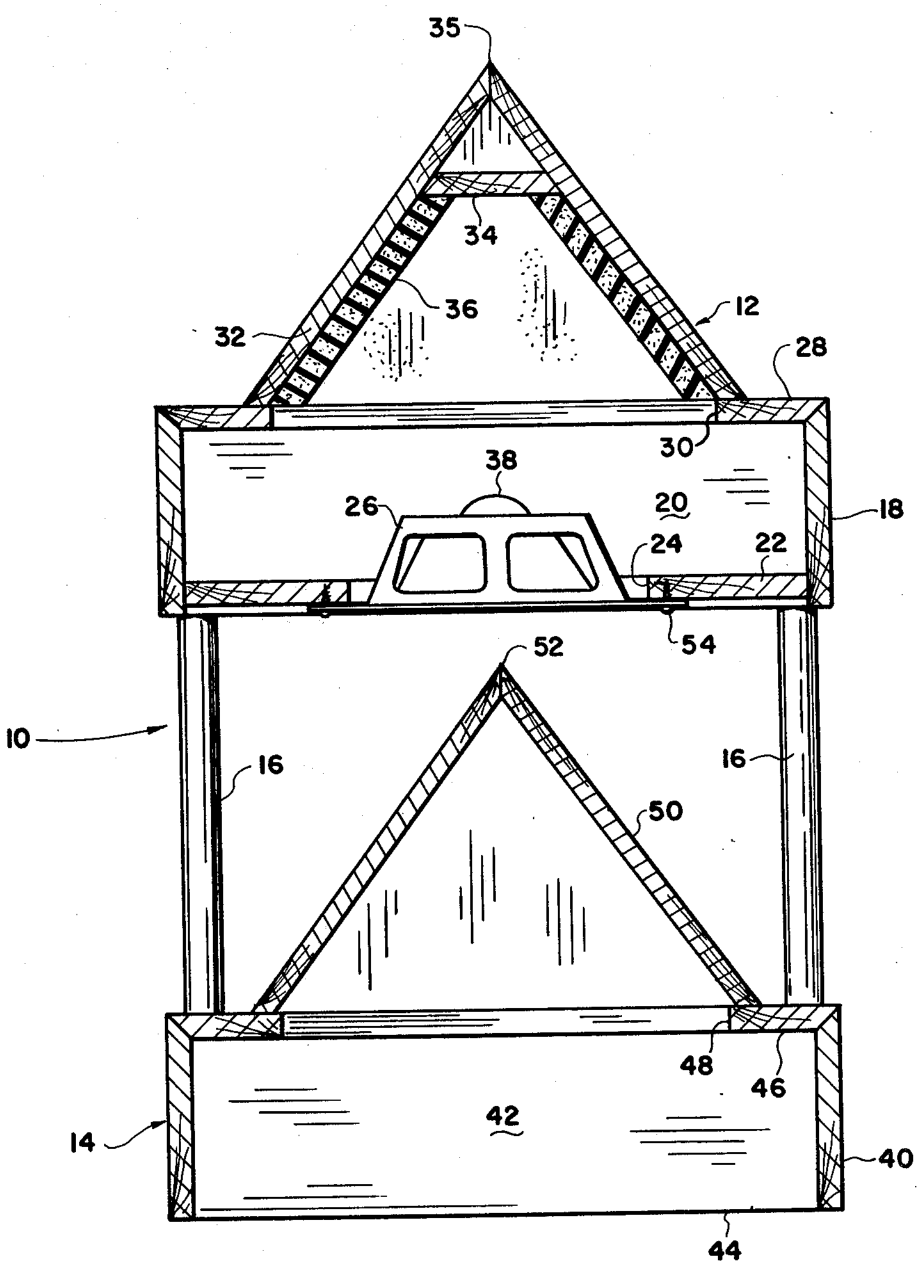
FIG. 1 is a sectional elevational view of a speaker assembly embodying the invention.

Referring to the drawings in detail, and particularly FIG. 1, reference character 10 generally indicates a speaker assembly comprising a first pyramidal housing 12 supported in spaced relation from a second pyramidal housing 14 in any suitable manner, such as by a plurality of spaced support posts 16. The first housing 12 comprises a base or open housing 18 preferably of substantially rectangular configuration, but not limited thereto, and having the outer periphery thereof closed by a continuous wall 20 as particularly shown in FIG. 1. The bottom 22 of the housing 18 as shown herein is provided with a central opening or aperture 24 whereby any suitable speaker 26 may be installed therein in any well known manner and for a purpose as will be hereinafter set forth. The top 28 of the housing 18 as shown herein is provided with a central opening 30 of a size at least as great as the outer diameter of the speaker 26 and in substantial alignment therewith. A hollow pyramid 32 is disposed on the outer surface of the top member 28 and surrounding the opening 30 whereby the interior of the pyramid 32 is in open communication with the interior of the housing 18. The pyramid 32 may be secured to the housing 18 in any suitable manner (not shown), and is preferably an integral unit therewith, but not limited thereto.

A baffle member 34 is secured to the interior of the pyramid 32 in the proximity of the point end 35 thereof and disposed in substantial alignment with the center of the speaker 26. In addition, suitable insulating material 36 is secured to the inner walls of the pyramid 32 in any well known manner and extends from the lower surface of the baffle 34 to the bottom of the pyramid 32.

Whereas the speaker 26 may be of any suitable type, it is preferable to provide a speaker having a conical baffle as shown at 38 which concentrates the greater part of the sound emitting therefrom in a direction away from the interior of the housing 18 and pyramid 32. That portion of the sonic frequency which travels in a rearward direction from the baffle 38 impinges the baffle 34 and is reflected outwardly for discharge through the aperture 30 and onto the outer periphery of the cone or baffle 38. The insulating material 36 absorbs any sonic frequency impinging against the inner periphery of the pyramid 32, thus greatly reducing or substantially eliminating any unwanted reflection or bouncing of the sound within the interior of the housing 12.

The housing 14 comprises an open housing 40 generally similar to the housing 18, and preferably of substantially the same outer dimension whereby the support posts 16 may be suitably secured at one end to the housing 40 and at the opposite end to the housing 18 for supporting the housing 12 in spaced relation with respect to the housing 14. The outer periphery of the housing 40 is closed by a wall 42, and the bottom of the housing 40 may be open as shown at 44, if desired. The top 46 of the housing 40 is provided with a centrally disposed opening or aperture 48 and a pyramid 50 is disposed on the outer surface of the top 46 surrounding the opening 48 wherein the interior of the pyramid 50 is in open communication with the interior of the housing 40. The pyramid 50 may be secured to the top 46 in any suitable manner (not shown), and is disposed in such a manner that the pointed end 52 thereof is disposed in substantial alignment with the longitudinal center of the conical baffle 38. The maximum outer dimension of the base of the pyramid 50 is at least as great as the maximum outer diameter of the baffle 38.

In use, the speaker 38 may be installed within the opening 34 in any well known manner, such as by a plurality of mounting screws 54, and may be operably connected with any suitable sound source (not shown) in the usual or well known manner (not shown). As sound is emitted from the speaker 36, the greater concentration of the sound is directed from the baffle 38 in a direction toward the pyramid 52. The sound "washes" over the flat sidewalls of the pyramid 50 and is equally spread around the unit 10 in all directions. Any sound leaving the rearward portions of the baffle 38 are directed into the interior of the housing 18 and pyramid 32. The sound impinging the insulation material is absorbed for reducing or precluding bouncing of the sound waves within the pyramid 32, and those sound waves impinging the baffle 34 are reflected directly onto the outer periphery of the baffle 38 for greatly reducing loss of sound in the unit 10.

Whereas a single speaker assembly 10 produces sound of an unusually good quality, it may be desirable to produce stereophonic effects with the sound system. In this event, it is preferable to utilize at least two of the units 10 disposed in spaced relation. It will be apparent that the universal sound dispensing effect from each speaker unit 10 will produce a stereophonic effect in substantially any position in the room or area wherein the speakers are installed. In addition, it has been found that the quality of the sound emitting from each speaker unit 10 is astoundingly pure and as a consequence it is possible to provide relatively loud sound with little or no distortion.

Figure 2:
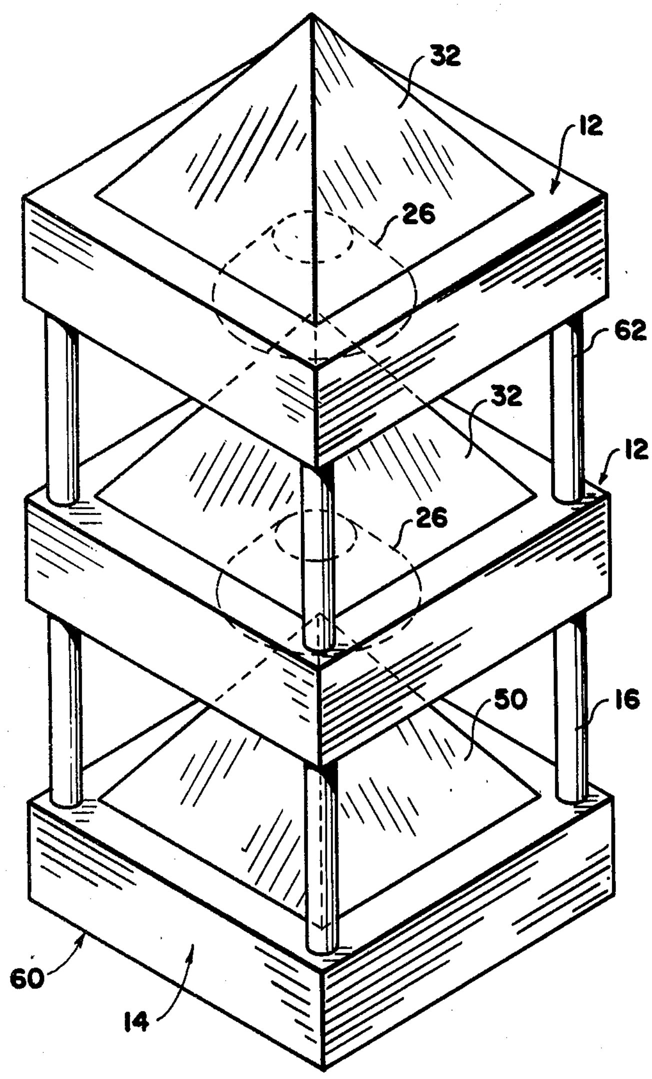
FIG. 2 is a perspective view of a modified speaker assembly of a stacked arrangement embodying the invention.

Referring now to FIG. 2, a modified speaker assembly 60 is shown which may be referred to as a stacked design speaker unit. The assembly 60 comprises at least two housings 12 mounted in longitudinally spaced relation by suitable support posts 62 and at least one housing 14 disposed in spaced relation with respect to the lowermost housing 12 as viewed in FIG. 2. Of course, each housing 12 is provided with its own speaker 26, and the sound emitting from each speaker 26 is directed over the outer periphery of the pyramid disposed in spaced relation thereto for producing sound in the manner as hereinbefore set forth.

Figure 3:
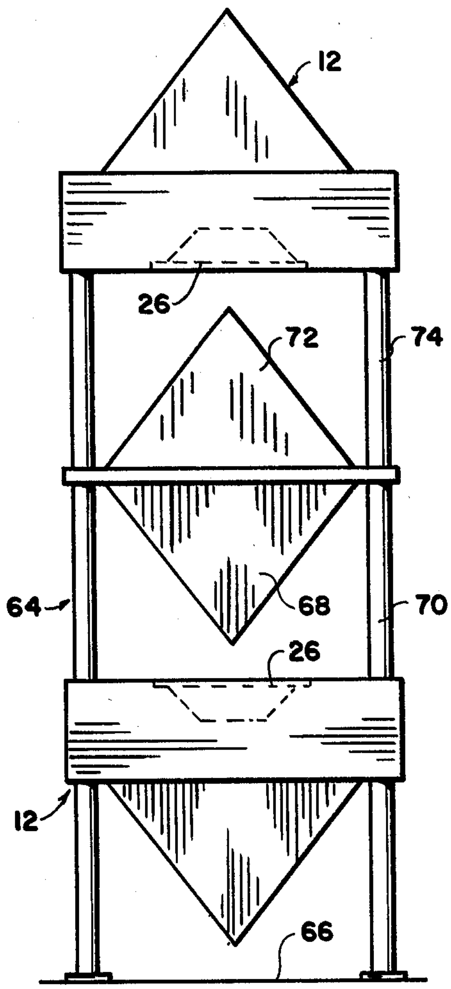
FIG. 3 is a side elevational view of another modification of a speaker assembly embodying the invention.

Referring now to FIG. 3, a speaker assembly 64 is shown which may be referred to as an "anti-pyramid" assembly. The assembly 64 comprises a first housing 12 supported from the floor 66, or other supporting surface, and in spaced relation thereto, and disposed in such a manner that the open end of the speaker 26 is directed away from the surface 66. A pyramid 68 is supported in spaced relation from the housing 12 by suitable support posts 70, and is disposed in alignment with the speaker 26 in the same manner as hereinbefore set forth in connection with the pyramid 50. The sound emitting from the speaker 26 "washed over" the outer periphery of the pyramid 68 for producing sound as hereinbefore set forth. In addition, a pyramid 72 substantially identical to the pyramid 68, but inverted with respect thereto is suitably secured to the upper end of the pyramid 68 as shown in FIG. 3, and a second housing 12 is supported thereabove by suitable support posts 74 in the manner as hereinbefore set forth. The sound emitting from the speaker 26 of the second housing 12 flows downwardly over the outer periphery of the pyramid 72 for producing sound in the manner as hereinbefore set forth.

Figure 4:
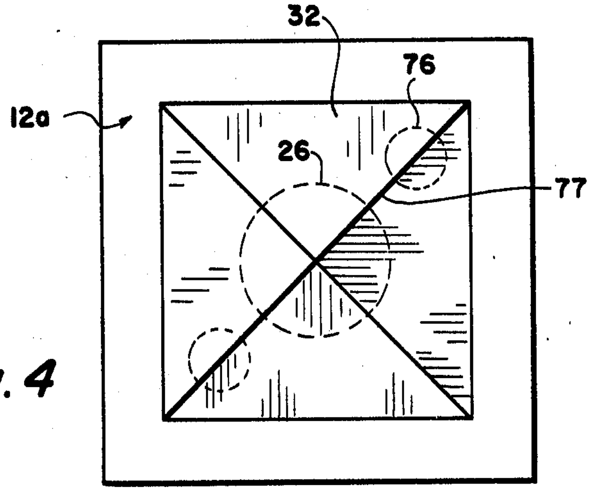
FIG. 4 is a top view of still another modified speaker assembly embodying the invention.

As shown in FIG. 4, it may be desirable to provide additional speakers, such as relatively small speakers 76 in a housing **12*a*, which is similar to the housing 12. In this event, it is important that the small speakers 76 be mounted in alignment with the ridge 77 of the pyramid 32. The production of sound from the housing 12*a* is substantially identical with the production of sound from the housing 12**.

Figure 5:
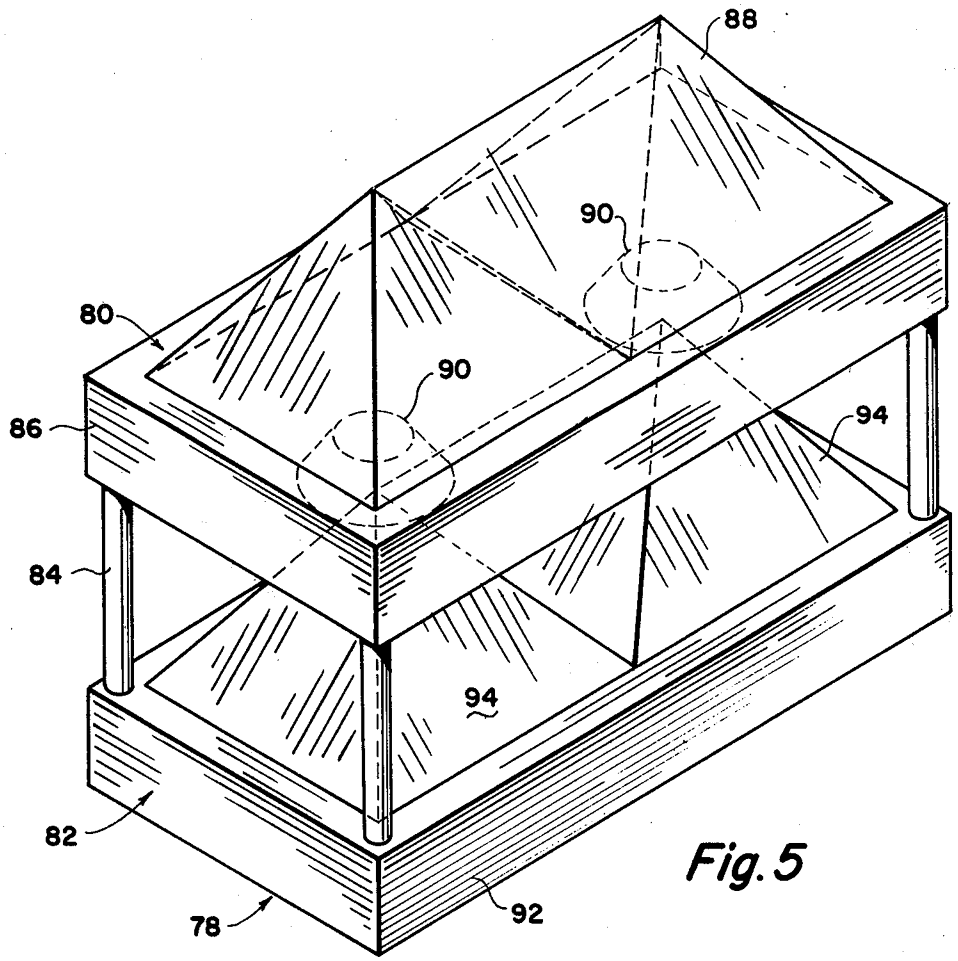
FIG. 5 is a perspective view of yet another modified speaker assembly embodying the invention.
Figure 6:
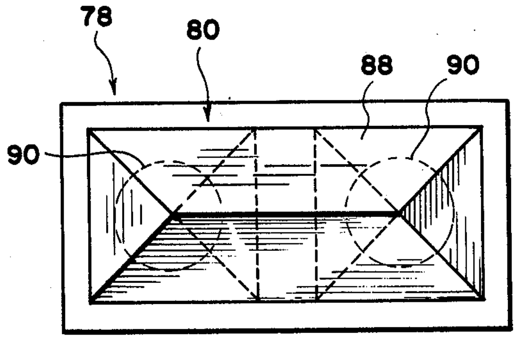
FIG. 6 is a top view of the speaker assembly shown in FIG. 5.
Figure 7:
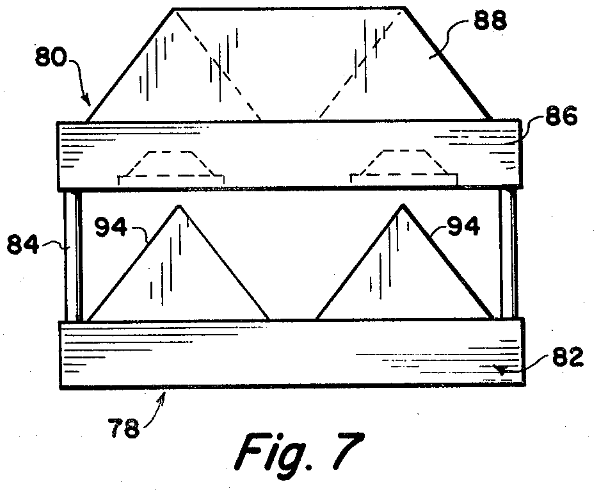
FIG. 7 is a side elevational view of the speaker assembly shown in FIG. 5.

FIGS. 5, 6 and 7 disclose another multi-speaker assembly 78 which comprises a first housing 80 spaced from a second housing 82 by suitable support posts 84 as hereinbefore set forth. The housing 80 comprises a substantially rectangular hollow housing 86 generally similar to the housing 18, and having a pair of substantially pyramidal housings 88 mounted therein in open communication with the interior thereof as in connection with the housing 18 and pyramid 32. A plurality of speakers 90 may be mounted in the housing 80 in spaced relation as shown in the drawings, and the speakers 90 are preferably similar to the speakers 26 and function in the same manner for producing sound.

The housing 82 comprises a housing 92 of rectangular configuration and generally similar to the housing 40, and a pair of substantially pyramidal housings 94 disposed on the upper surface thereof as viewed in the drawings, and in spaced relation with respect to the speakers 90 for producing sound in the manner and of the same general quality as hereinbefore set forth.

From the foregoing it will be apparent that the present invention provides a novel speaker assembly utilizing pyramids in combination with speaker elements for producing sound of a quality not heretofore possible. In addition, the speaker assemblies are of an economical and durable construction.

Whereas the present invention has been described in particular relation to the drawings attached hereto, it should be understood that other and further modifications, apart from those shown or suggested herein may be made within the spirit and scope of this invention.

What is claimed is:

1. A speaker assembly comprising a base member having one end thereof open and an aperture provided in the opposite end thereof, a pyramidal shaped housing member secured to the base member in the proximity of the aperture and having one end closed and the opposite end open to the aperture, a second base member secured in spaced relation to the first base member whereby the housing member is interposed therebetween, said second base member having apertures provided in the opposite ends thereof, a second housing member secured to the outer end of the second base member in the proximity of the respective aperture therein and having one end closed and the opposite end open to said respective aperture, and speaker means secured to the inner end of the second base member and disposed in the aperture of said inner end thereof.

2. The assembly of claim 1 wherein the interior of said second pyramidal housing is exposed towards said speaker through said open end and includes sound absorbing material therein.

3. The assembly of claim 1 including at least one additional speaker supported between said first and second housings such that its directional axis is parallel to the directional axis of said main speaker and in alignment with a ridge of said pyramidal housing.

4. The assembly of claim 1 including a plurality of axially stacked assemblies of claim 1.

* * * * *